United States Patent
Yamane et al.

(10) Patent No.: US 12,262,483 B2
(45) Date of Patent: Mar. 25, 2025

(54) ELECTRONIC DEVICE HOUSING

(71) Applicant: Mitsubishi Electric Corporation, Tokyo (JP)

(72) Inventors: Hisakazu Yamane, Tokyo (JP); Takaaki Tanaka, Tokyo (JP); Kazuhisa Tamura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 416 days.

(21) Appl. No.: 17/631,562

(22) PCT Filed: Dec. 12, 2019

(86) PCT No.: PCT/JP2019/048629
§ 371 (c)(1),
(2) Date: Jan. 31, 2022

(87) PCT Pub. No.: WO2021/117179
PCT Pub. Date: Jun. 17, 2021

(65) Prior Publication Data
US 2022/0279664 A1    Sep. 1, 2022

(51) Int. Cl.
*H05K 5/00* (2006.01)
*H05K 5/03* (2006.01)
*H05K 5/06* (2006.01)

(52) U.S. Cl.
CPC ............. *H05K 5/0013* (2013.01); *H05K 5/03* (2013.01); *H05K 5/062* (2013.01)

(58) Field of Classification Search
CPC ........ H05K 5/0013; H05K 5/03; H05K 5/062; H05K 5/0221; H05K 5/0052; H05K 5/0217; H05K 5/0004
(Continued)

(56) References Cited

U.S. PATENT DOCUMENTS 5,379,912 A * 1/1995 Wolf ................... B60R 16/0239
220/345.6
6,099,097 A * 8/2000 Hocker ................... G06F 1/181
16/257
(Continued)

FOREIGN PATENT DOCUMENTS

CN  102639979 A  8/2012
CN  109845420 A  6/2019
(Continued)

OTHER PUBLICATIONS

Chinese Office Action issued Dec. 6, 2023 in Application No. 201980102817.0.
(Continued)

*Primary Examiner* — Hiwot E Tefera
(74) *Attorney, Agent, or Firm* — Sughrue Mion, PLLC

(57) ABSTRACT

An electronic device housing includes: a case having a bottom-surface portion and side-surface portions; and a cover covering an opening enclosed by the side-surface portions. At positions along each of at least two opposing side lines of the cover, two flexible arm portions are provided so as to extend toward the bottom-surface portion, and two protrusions are provided between the two arm portions so as to protrude and are held between the two arm portions. Contact parts of either the arm portions or the protrusions have curved-surface portions, and contact parts of others have flat-surface portions. Two of the flat-surface portions provided on a side of each side line of the cover where the two arm portions are provided are inclined such that an interval between the flat-surface portions is narrowed toward the bottom-surface portion. The arm portions bend while pressing the protrusions at positions contacting with the protrusions.

11 Claims, 17 Drawing Sheets

(58) Field of Classification Search
USPC .................................................. 312/223.1
See application file for complete search history.

(56) References Cited

U.S. PATENT DOCUMENTS

| | | | | | |
|---|---|---|---|---|---|
| 6,262,366 | B1* | 7/2001 | Ichikawa | ............. | H05K 5/0013 174/50 |
| 6,375,283 | B1* | 4/2002 | Kitamura | ............. | H04B 1/3833 292/87 |
| 9,041,867 | B2* | 5/2015 | Wu | ............. | G06F 1/1601 348/836 |
| 10,638,083 | B1* | 4/2020 | Monroe | ............. | F16M 11/041 |
| 2004/0101356 | A1* | 5/2004 | Cheng | ............. | E05B 65/006 403/353 |
| 2005/0007747 | A1* | 1/2005 | Axelrod | ............. | H05K 5/04 361/752 |
| 2005/0062372 | A1* | 3/2005 | Mukougawa | ............. | H05K 5/0013 312/223.1 |
| 2010/0089604 | A1* | 4/2010 | Tang | ............. | H05K 5/0013 174/50 |
| 2010/0165219 | A1* | 7/2010 | Ikunami | ............. | G06F 1/1656 348/836 |
| 2010/0201235 | A1* | 8/2010 | Chen | ............. | F16B 21/065 312/223.1 |
| 2011/0239418 | A1* | 10/2011 | Huang | ............. | H05K 5/0013 24/592.11 |
| 2012/0027511 | A1* | 2/2012 | Wei | ............. | H05K 5/0013 403/381 |
| 2012/0307433 | A1* | 12/2012 | Takahashi | ............. | H05K 5/0013 361/679.01 |
| 2015/0061476 | A1* | 3/2015 | Ishikura | ............. | H05K 5/0004 312/223.1 |
| 2015/0085445 | A1* | 3/2015 | Zadesky | ............. | G06F 1/1656 361/679.56 |
| 2020/0015379 | A1 | 1/2020 | Fukuda | | |
| 2020/0411812 | A1* | 12/2020 | Conrad | ............. | H01M 50/247 |

FOREIGN PATENT DOCUMENTS

| | | | |
|---|---|---|---|
| JP | 5539476 | B2 | 7/2014 |
| JP | 5570568 | B2 | 8/2014 |

OTHER PUBLICATIONS

International Search Report of PCT/JP2019/048629 dated Feb. 25, 2020 [PCT/ISA/210].

* cited by examiner

ELECTRONIC DEVICE HOUSING

CROSS REFERENCE TO RELATED APPLICATIONS

This application is a National Stage of International Application No. PCT/JP2019/048629 filed on Dec. 12, 2019.

TECHNICAL FIELD

The present disclosure relates to an electronic device housing.

BACKGROUND ART

An electronic device is stored in an electronic device housing adapted to characteristics of the electronic device, a usage environment thereof, and the like, and if the electronic device is for on-vehicle usage, the electronic device is mounted on a vehicle together with the electronic device housing. In an on-vehicle electronic device housing, a general method for fixing components forming the electronic device housing is connection using screws. In recent years, in view of weight reduction, cost reduction, improvement in ease of assembly, and the like, the number of components has been required to be reduced, and an electronic device housing structure not using screws is disclosed (see, for example, Patent Document 1).

In the structure shown in Patent Document 1, for example, two resin parts (e.g., a cover and a case) for forming a housing are connected by being fitted to each other. One of the two parts has a hook and the other has a rib. The two parts are fixed with the hook and the rib fitted to each other. If an electronic device stored in the electronic device housing is an on-vehicle radar device, the electronic device includes an antenna board with an antenna formed. The distance between the antenna board and a cover which is a part covering the antenna board greatly influences radar characteristics of the on-vehicle radar device.

CITATION LIST

Patent Document

Patent Document 1: Japanese Laid-Open Patent Publication No. 2014-86603

SUMMARY OF THE INVENTION

Problems to be Solved by the Invention

In the housing structure shown in Patent Document 1, screws are not needed, so that the number of components can be decreased. However, internal components to be stored in the electronic device housing have various heights. If the height is great, the hook and the rib cannot be fitted to each other, thus causing a problem that the two parts of the housing cannot be fixed. Meanwhile, if the height is small, the hook and the rib can be fitted to each other but a gap is formed between the internal component and the housing, so that the distance between the internal component and the housing is not stabilized, thus causing a problem that the internal component cannot be stably fixed by the housing.

In addition, if the electronic device stored in the electronic device housing is an on-vehicle radar device and the height of the internal component is small, the distance between the cover and an antenna board included in the internal component is not stabilized, so that the internal component cannot be stably fixed by the housing, thus causing a problem that it is difficult to uniformly stabilize radar characteristics among products.

The present disclosure has been made to solve the above problems, and an object of the present disclosure is to provide an electronic device housing that enables an internal component stored in the electronic device housing to be stably fixed inside the electronic device housing.

Solution to the Problems

An electronic device housing according to the present disclosure includes: a case having a bottom-surface portion in a rectangular shape and side-surface portions provided so as to stand around the bottom-surface portion; and a cover opposed to the bottom-surface portion and covering an opening enclosed by ends of a plurality of the side-surface portions. At positions along each of at least two opposing side lines of the cover, two flexible arm portions are provided so as to extend toward the bottom-surface portion along the corresponding side-surface portion, and two protrusions are provided between the two arm portions so as to protrude from the side-surface portion and are held between the two arm portions so as to contact therewith. Contact parts of either the arm portions or the protrusions have curved-surface portions, and contact parts of others have flat-surface portions. Two of the flat-surface portions provided on a side of each side line of the cover where the two arm portions are provided are inclined such that an interval between the two flat-surface portions is narrowed toward the bottom-surface portion. The arm portions bend while pressing the protrusions at positions contacting with the protrusions.

Effect of the Invention

The electronic device housing according to the present disclosure enables an internal component stored in the electronic device housing to be stably fixed inside the electronic device housing.

DESCRIPTION OF EMBODIMENTS

Figure 1:
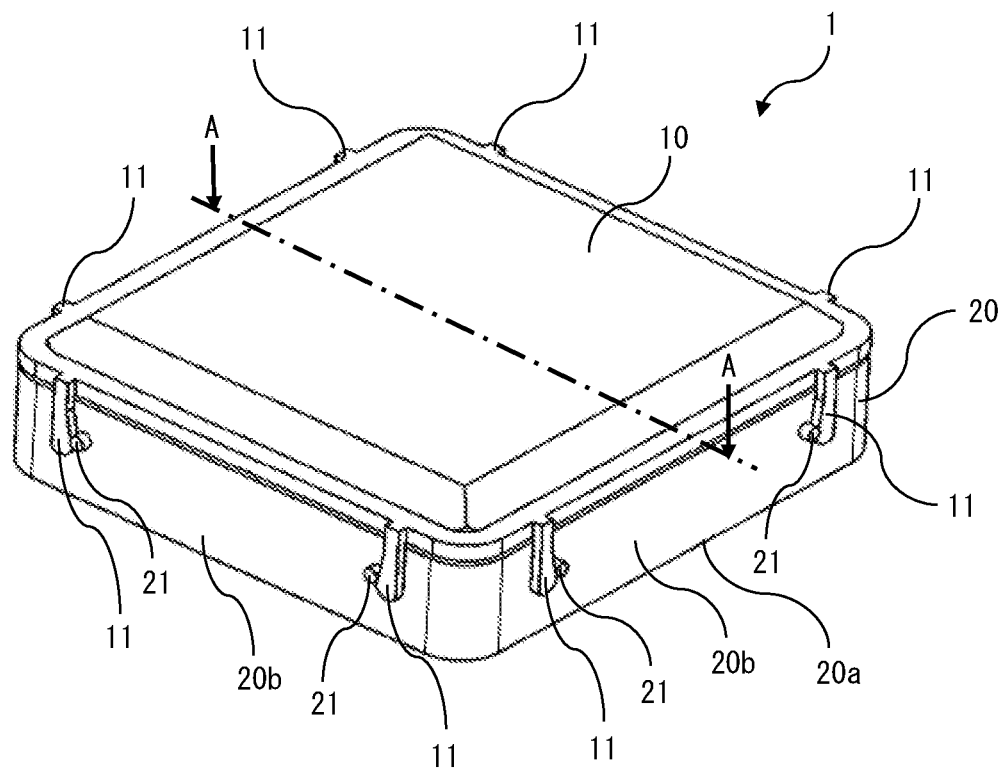
FIG. 1 is a perspective view showing the outer appearance of an electronic device housing according to embodiment 1.

Hereinafter, an electronic device housing according to embodiments of the present disclosure will be described with reference to the drawings. In the drawings, the same or corresponding members and parts are denoted by the same reference characters, to give description.

Embodiment 1

Figure 2:
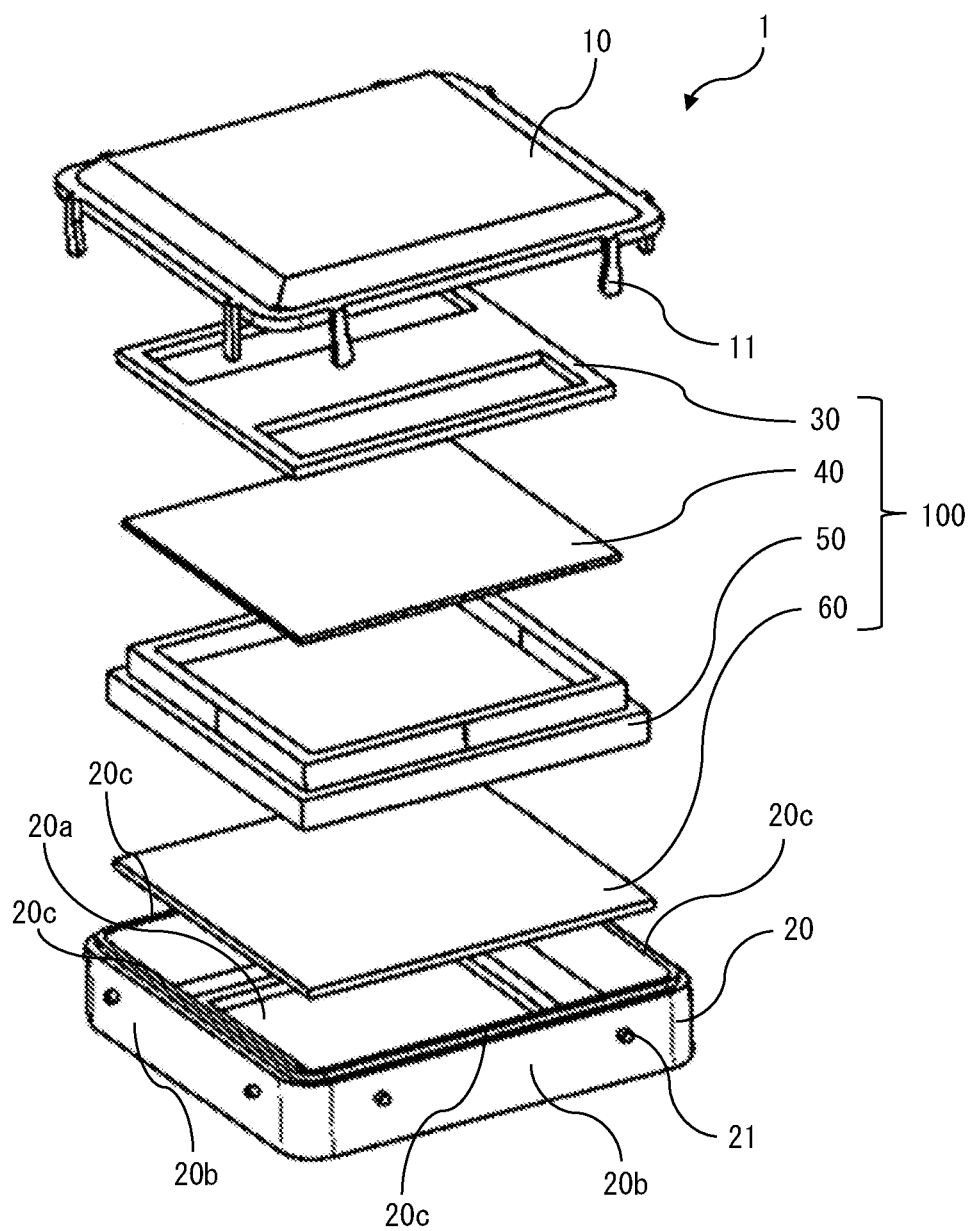
FIG. 2 is an exploded perspective view showing an internal component and the electronic device housing according to embodiment 1.
Figure 3:
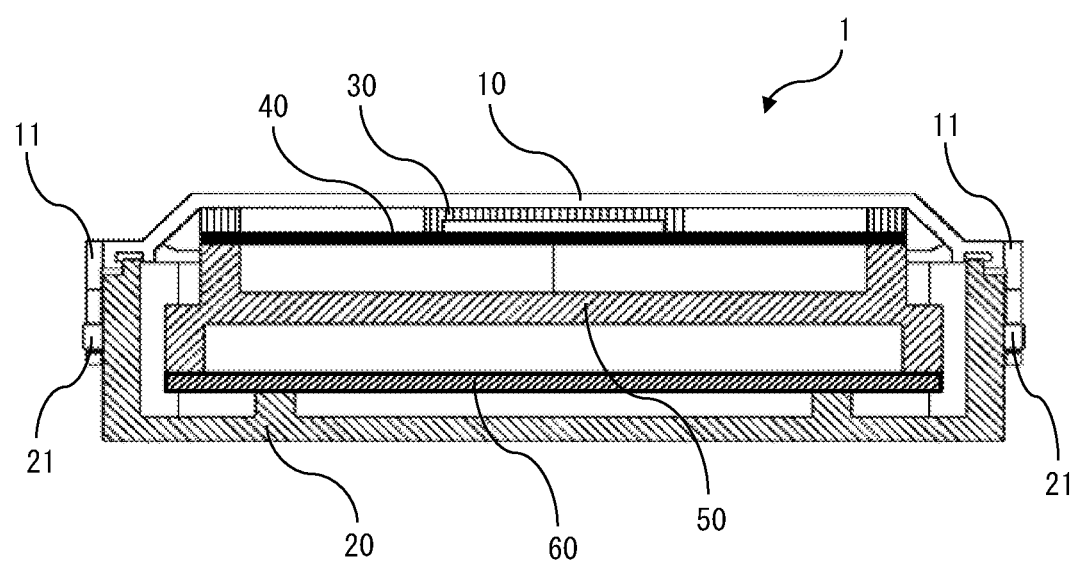
FIG. 3 is a sectional view along dotted-dashed line A-A in FIG. 1.

FIG. 1 is a perspective view showing the outer appearance of an electronic device housing 1, FIG. 2 is an exploded perspective view of the electronic device housing 1 and an internal component 100, and FIG. 3 is a sectional view along dotted-dashed line A-A in FIG. 1. As shown in FIG. 2, the electronic device housing 1 storing an electronic device or the like as the internal component 100 includes a case 20 and a cover 10. The case 20 has a bottom-surface portion 20a in a rectangular shape and side-surface portions 20b provided so as to stand around the bottom-surface portion 20a. The cover 10 is opposed to the bottom-surface portion 20a and covers an opening enclosed by ends 20c of a plurality of the side-surface portions 20b. The cover 10 is made of resin, and is formed from polybutyleneterephthalate (PBT), acrylonitrile butadiene styrene (ABS), or the like. The case 20 is made of resin as with the cover 10, or made of metal such as aluminum.

As shown in FIG. 1, on each of side lines enclosing the cover 10, two flexible arm portions 11 are provided at positions along the side line so as to extend toward the bottom-surface portion 20a along the side-surface portions 20b. Two protrusions 21 are provided between the two arm portions 11 so as to protrude from the side-surface portion 20b. The two protrusions 21 are held between the two arm portions 11 so as to contact therewith. The arm portion 11 and the protrusion 21 are respectively made of the same materials as the cover 10 and the case 20 to which the arm portion 11 and the protrusion 21 are respectively provided. Here, two arm portions 11 are provided to every side line of the cover 10, but without limitation thereto, two arm portions 11 may be provided to each of two opposing side lines of the cover 10. Two arm portions 11 only have to be provided to each of at least two opposing side lines of the cover 10.

An example in which the electronic device housing 1 is used for an on-vehicle radar device and a millimeter wave radar is stored as the internal component 100 in the electronic device housing 1, will be described. The internal component 100 includes a radio-wave shield 30, an antenna board 40, a heatsink 50, and a control board 60. At the antenna board 40, an antenna (not shown) is formed, and the vertically upward direction of the cover 10 is the radar transmission direction. The radio-wave shield 30 is provided between the cover 10 and the antenna board 40. Between the antenna board 40 and the control board 60, the heatsink 50 for suppressing heat generation in these boards is provided. As shown in FIG. 3, the internal component 100 is stored in a stacked manner inside the case 20, and is held between the cover 10 and the case 20. The distance between the antenna board 40 and the cover 10 greatly influences radar characteristics of the on-vehicle radar device. If the distance between the antenna board 40 and the cover 10 can be stably made equal to the height of the radio-wave shield 30, radar characteristics can be stabilized. Here, the arm portions 11 bend while pressing the protrusions 21 at positions contacting with the protrusions 21, whereby the internal component 100 is pressed by the cover 10 toward the bottom-surface portion 20a. Thus, the distance between the antenna board 40 and the cover 10 is stabilized, and the internal component 100 is stably fixed by the cover 10. Hereinafter, this pressing structure will be described.

Figure 4:
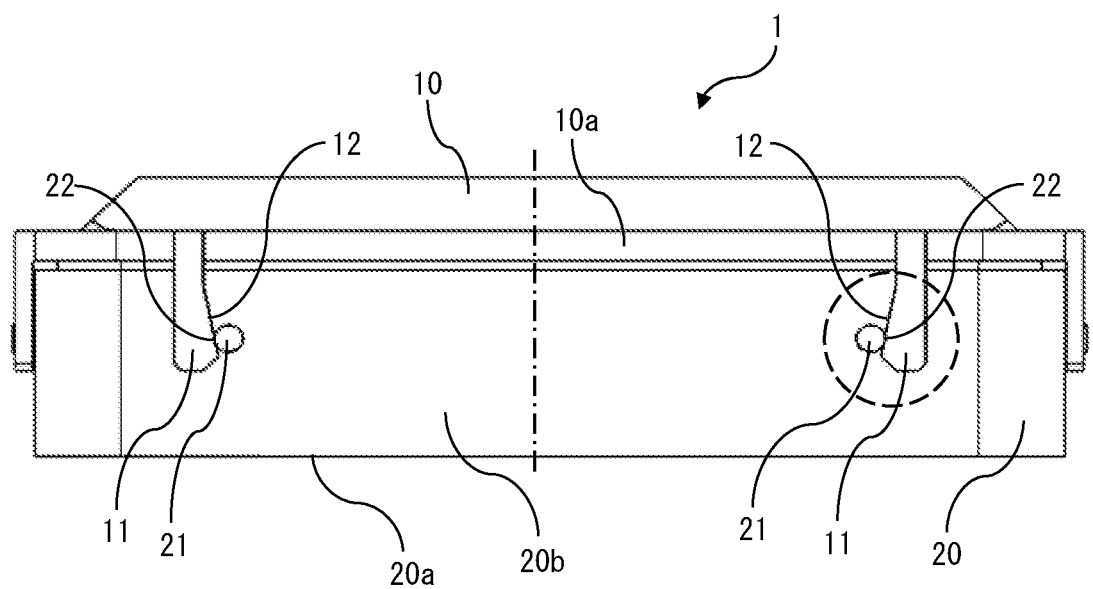
FIG. 4 is a side view of the electronic device housing according to embodiment 1.
Figure 5:
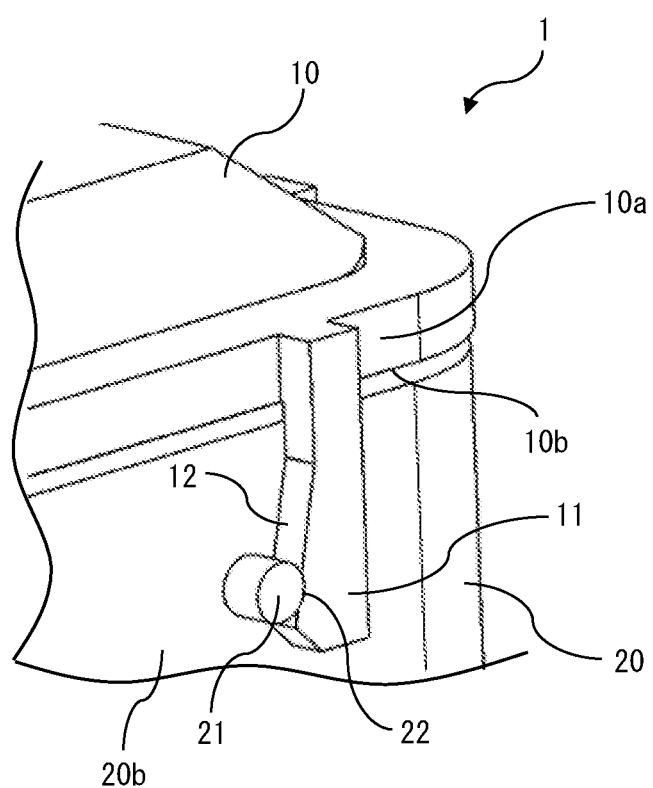
FIG. 5 is a perspective view showing a pressing structure of the electronic device housing according to embodiment 1.
Figure 6:
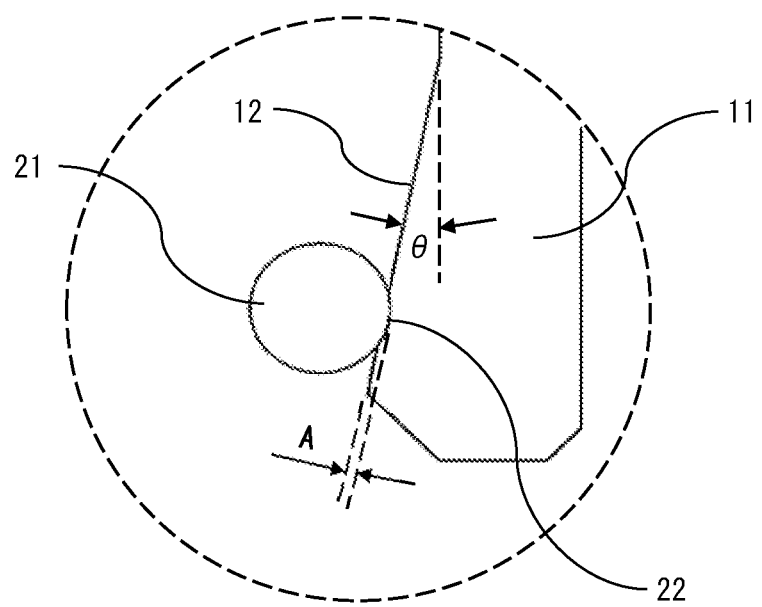
FIG. 6 is a side view illustrating the pressing structure of the electronic device housing according to embodiment 1.
Figure 7:
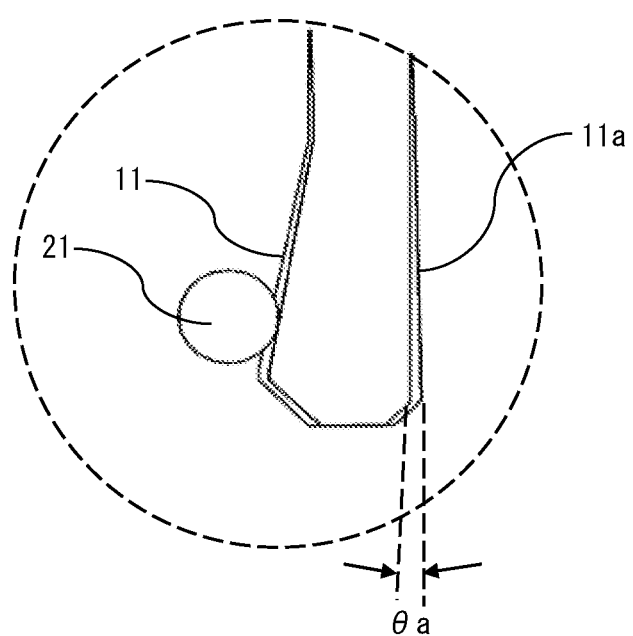
FIG. 7 is a side view illustrating a pressing operation of the electronic device housing according to embodiment 1.
Figure 8:
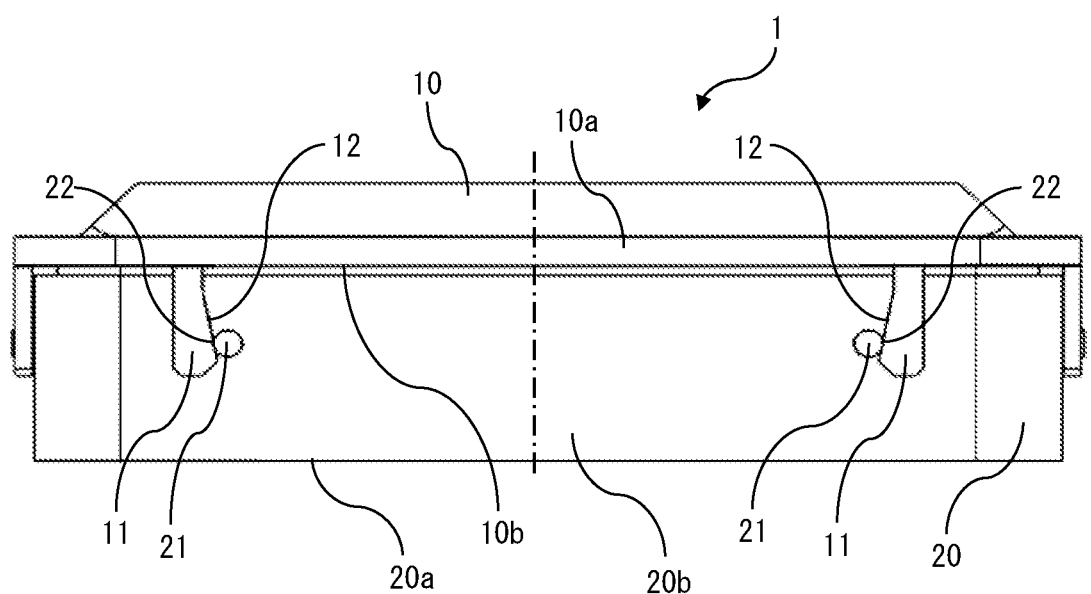
FIG. 8 is a side view showing another electronic device housing according to embodiment 1.

FIG. 4 is a side view of the electronic device housing 1 according to embodiment 1, FIG. 5 is an enlarged perspective view showing the pressing structure at a specific part of the electronic device housing 1, FIG. 6 is a side view illustrating the pressing structure of the electronic device housing 1, and FIG. 7 is a side view illustrating a pressing operation of the electronic device housing 1. FIG. 6 and FIG. 7 are enlarged views showing a part enclosed by a broken line in FIG. 4. In FIG. 6, the arm portion 11 in an original state of being provided to the cover 10 (a state of not bending), and the protrusion 21, are shown in an overlapping manner. As shown in FIG. 4, the two arm portions 11 are provided near ends of the cover 10 at positions line-symmetric with respect to the center line of the cover 10. Each arm portion 11 extends from the cover 10 vertically to the cover 10 toward the bottom-surface portion 20a. As shown in FIG. 5, the arm portion 11 is provided at a side-surface portion 10a of the cover 10 integrally with the cover 10. The position and the direction where the arm portion 11 is provided are not limited thereto. The arm portion 11 may be provided closely to the center line, and may be provided so as to be inclined instead of being vertical. The position where the arm portion 11 is provided is not limited to the side-surface portion 10a of the cover 10. As shown in FIG. 8, with the outer periphery of the cover 10 expanded, the arm portion 11 may be provided at an opposed surface 10b opposed to the case 20 of the cover 10. The protrusion 21 is formed in a columnar shape.

A contact part of either the arm portion 11 or the protrusion 21 has a curved-surface portion, and a contact part of the other has a flat-surface portion. Here, an example in which a flat-surface portion 12 is provided to the arm portion 11 and a curved-surface portion 22 is provided in a columnar shape to the protrusion 21, will be described. As shown in FIG. 4, two flat-surface portions 12 are inclined such that the interval between the two flat-surface portions 12 is narrowed toward the bottom-surface portion 20a. The two flat-surface portions 12 are provided on a side of each side line of the cover 10 where the two arm portions 11 are provided. As shown in FIG. 6, inclination of the flat-surface portion 12 can be defined as an angle with respect to the direction in which the arm portion 11 extends toward the bottom-surface portion 20a, and here, the angle of the inclination is denoted by θ. The arm portion 11 and the protrusion 21 are arranged in such a positional relationship that causes overlap A. In FIG. 7, an arm portion 11a that contacts with the protrusion 21 and presses the protrusion 21 is shown additionally to FIG. 6. When the arm portion 11 presses the protrusion 21, as shown in FIG. 7, the arm portion 11 bends by θa. Here, θa denotes an angle between the direction in which the arm portion 11 extends toward the bottom-surface portion 20a and the direction in which the arm portion 11 bending by the arm portion 11 and the protrusion 21 contacting with each other extends. The flat-surface portion 12 is formed so that θ is greater than θa. The reason is that, after the arm portion 11 and the protrusion 21 contact with each other, the contact is kept so that the cover 10 will not come off the case 20. If the flat-surface portion 12 is formed with θ≤θa, the contact is not kept and the cover 10 comes off the case 20.

Figure 9:
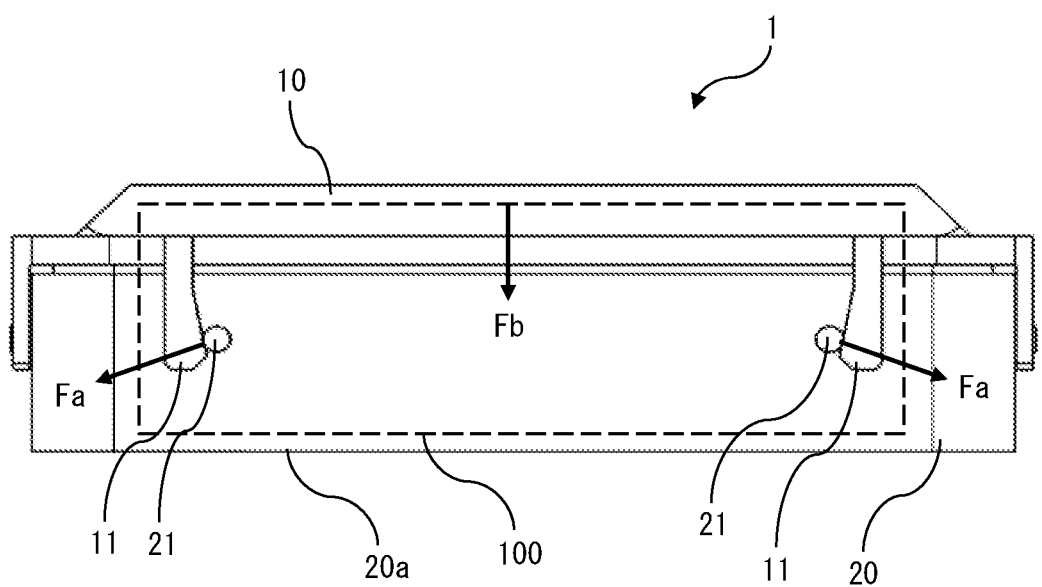
FIG. 9 illustrates forces acting on the electronic device housing according to embodiment 1.

FIG. 9 illustrates forces acting on the electronic device housing 1 according to embodiment 1. In FIG. 9, forces generated when each arm portion 11 bends by the arm portion 11 and the protrusion 21 contacting with each other are schematically shown additionally to the side view of the electronic device housing 1. When the arm portion 11 and the protrusion 21 contact with each other, the arm portion 11 presses the protrusion 21 at a position contacting with the protrusion 21, and the arm portion 11 bends with a force Fa in a direction normal to a tangent line between the flat-surface portion 12 and the curved-surface portion 22. With this force Fa, a force Fb to bend the cover 10 is generated. With the force Fb, the internal component 100 (schematically shown by a broken line) stored in the case 20 is pressed by the cover 10 toward the bottom-surface portion 20a. By the pressing, the internal component 100 is stably fixed inside the electronic device housing 1.

Figure 10:
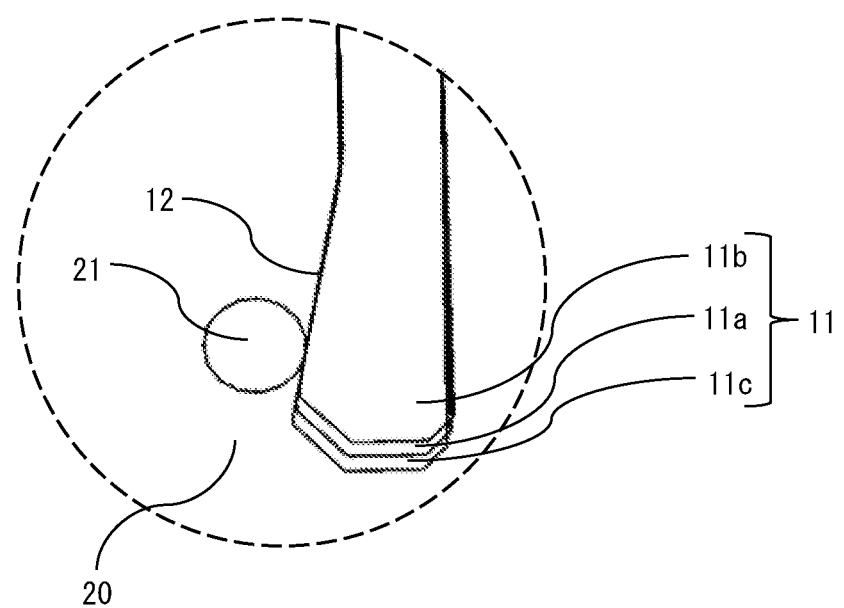
FIG. 10 is a side view illustrating the pressing structure of the electronic device housing according to embodiment 1.

FIG. 10 is a side view illustrating the pressing structure of the electronic device housing 1 according to embodiment 1. FIG. 10 is an enlarged view of the part enclosed by the broken line in FIG. 4, and additionally shows arm portions 11b, 11c contacting with the protrusion 21 correspondingly to varying heights of the internal component 100. A height obtained by summing heights of individual members stored as the internal component 100 is the height of the internal component 100. If the height of the internal component 100 is a design value, the arm portion 11 is positioned as the arm portion 11a. If the height of the internal component 100 is greater than the design value, the cover 10 (not shown in FIG. 10) moves in a direction away from the case 20, so that the arm portion 11 is positioned as the arm portion 11b. If the height of the internal component 100 is smaller than the design value, conversely, the arm portion 11 is positioned as the arm portion 11c. The height of the internal component 100 varies depending on the configuration of members stored as the internal component 100, and is approximately ±0.5 mm, for example. As is found from FIG. 10, even if the height of the internal component 100 varies, the angle θa by which the arm portion 11 bends hardly changes, and therefore inclinations of the flat-surface portions 12 of the arm portions 11a, 11b, 11c almost coincide with each other. Thus, even if the height of the internal component 100 varies, the force Fa is almost constant, and also the force Fb to press the internal component 100 hardly changes. Even if the height of the internal component 100 is changed, the internal component 100 is stably fixed inside the electronic device housing 1.

Two reasons why the pressing is kept even when the height of the internal component varies will be described. The first reason is that the angle θ of inclination of the flat-surface portion 12 is in a range of 10 degrees to 20 degrees and thus is a comparatively small angle. The second reason is that, since one contact part is the curved-surface portion 22, the contact position between the protrusion 21 and the arm portion 11 can freely move in accordance with variation in the height of the internal component 100. Although depending on the positional relationship between the flat-surface portion 12 and the curved-surface portion 22, since the angle θ is in a range of 10 degrees to 20 degrees, the angle θa is approximately in a range of 10 degrees to 20 degrees. Setting the lower limit of the angle θ at 10 degrees is for obtaining the force Fb needed for the pressing. If the angle θ is smaller than 10 degrees, the angle θa by which the arm portion 11 bends is also smaller than 10 degrees, so that the bending amount of the arm portion 11 is small and the force Fb needed for the pressing cannot be obtained. Setting the upper limit of the angle θ at 20 degrees is for preventing plastic deformation of the arm portion 11. If the angle θ is greater than 20 degrees, the angle θa by which the arm portion 11 bends is also greater than 20 degrees, so that the bending amount of the arm portion 11 is great and the arm portion 11 is plastically deformed. If the arm portion 11 is plastically deformed, the force Fb needed for the pressing cannot be stably obtained.

Figure 11:
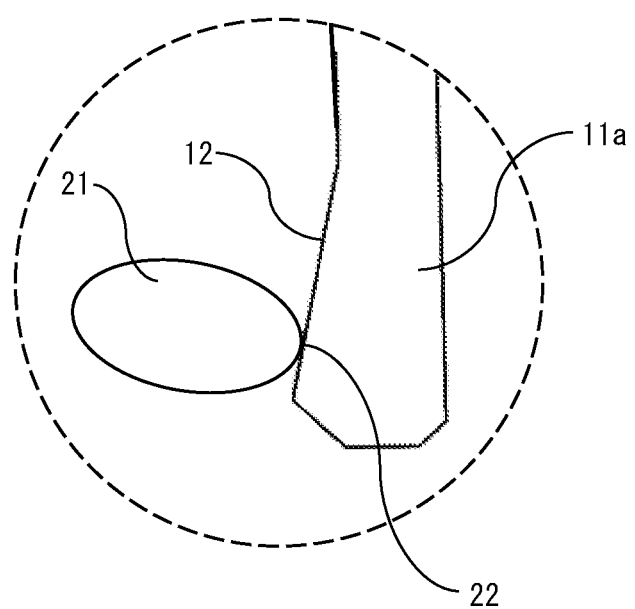
FIG. 11 is a side view showing the pressing structure of the electronic device housing according to embodiment 1.

In the above description, the curved-surface portion 22 of the protrusion 21 is formed in a columnar shape, but the shape of the protrusion 21 is not limited to the columnar shape. As shown in FIG. 11, the protrusion 21 may be formed in an elliptic shape as long as the protrusion 21 has the curved-surface portion 22. In the above description, the example in which a millimeter wave radar is stored as the internal component 100 in the electronic device housing 1 has been described. However, the internal component 100 stored in the electronic device housing 1 is not limited to the millimeter wave radar. A device different from such an on-vehicle radar device may be stored as an internal component in the electronic device housing 1.

As described above, in the electronic device housing 1 according to embodiment 1, the protrusion 21 has the curved-surface portion 22 at a position contacting with the arm portion 11, and the arm portion 11 has the flat-surface portion 12 at a position contacting with the protrusion 21. The two flat-surface portions 12 provided on a side of each side line of the cover 10 where the two arm portions 11 are provided are inclined such that the interval between the two flat-surface portions 12 is narrowed toward the bottom-surface portion 20a. The arm portions 11 bend while pressing the protrusions 21 at positions contacting with the protrusions 21, so that the internal component 100 stored in the case 20 is pressed by the cover 10 toward the bottom-surface portion 20a. Thus, the internal component 100 stored in the electronic device housing 1 can be stably fixed inside the electronic device housing 1. In addition, since the flat-surface portion 12 and the curved-surface portion 22 are in line-to-line contact with each other, the pressing to the protrusion 21 by the arm portion 11 can be kept even if the height of the internal component 100 varies. In addition, since the flat-surface portion 12 is provided to the arm portion 11 and the curved-surface portion 22 is provided to the protrusion 21, an end part of the arm portion 11 is not a complicated shape including a curved surface, and therefore the cover 10 including the arm portions 11 can be manufactured through a simple manufacturing process. In addition, since the curved-surface portion 22 has a columnar shape, the structure is simple and therefore manufacturing can be performed through a simple manufacturing process. Since inclination of the flat-surface portion 12 is set so that θ is greater than θa, even after the arm portions 11 bend and are fitted to the protrusions 21, the cover 10 will not come off the case 20 and fitting between the cover 10 and the case 20 can be kept. In addition, since the angle between the direction in which the arm portion 11 extends and the direction in which the arm portion 11 bending by the arm portion 11 and the protrusion 21 contacting with each other extends is in a range of 10 degrees to 20 degrees, even if the height of the internal component 100 is changed, connection between the cover 10 and the case 20 is kept, and without plastic deformation of the arm portion 11, the force Fb needed for pressing the internal component 100 can be obtained. In addition, if a millimeter wave radar is stored as the internal component 100 in the electronic device housing 1, the distance between the antenna board 40 and the cover 10 can be stably made equal to the height of the radio-wave shield 30, and thus radar characteristics can be uniformed and stabilized among products. Since the cover 10 and the case 20 are connected by contacting with each other, the cover 10 and the case 20 can be easily attached and detached, and thus inspection and replacement of the internal component 100, and the like, can be easily performed.

Embodiment 2

Figure 12:
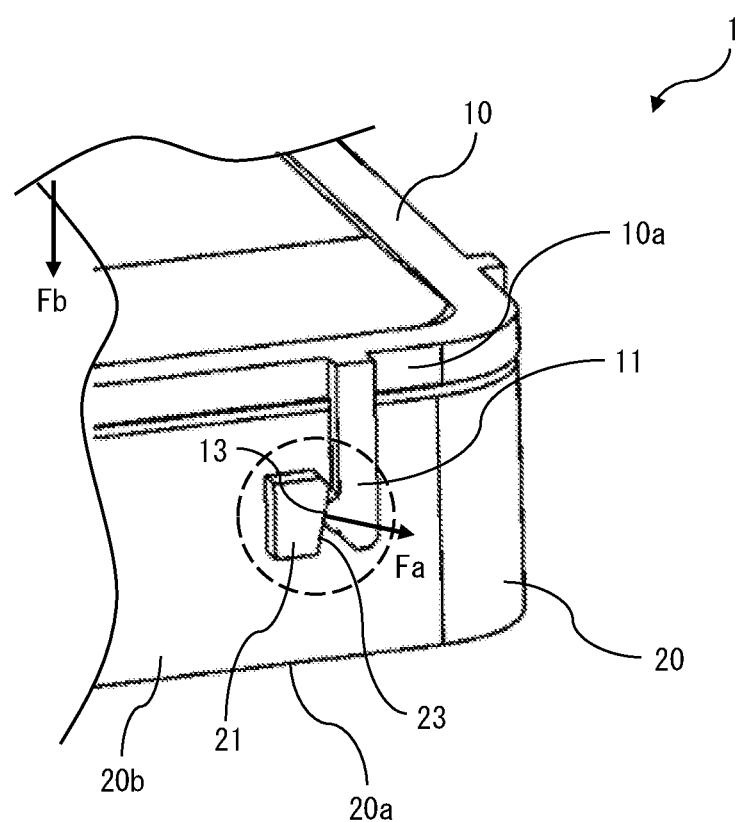
FIG. 12 is a perspective view showing a pressing structure of an electronic device housing according to embodiment 2.
Figure 13:
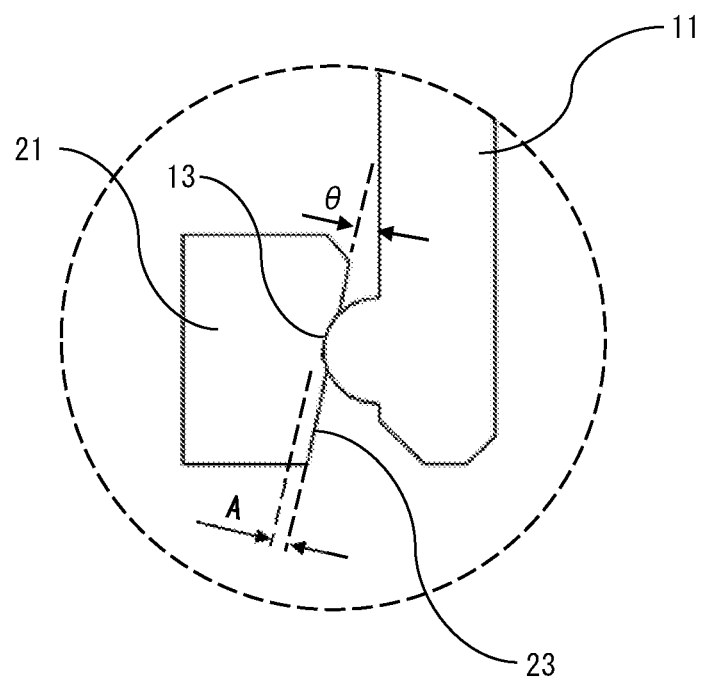
FIG. 13 is a side view illustrating the pressing structure of the electronic device housing according to embodiment 2.
Figure 14:
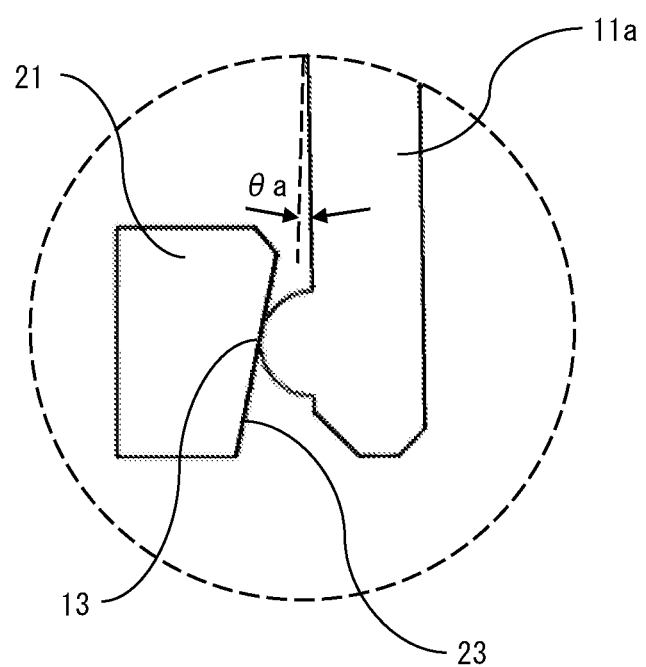
FIG. 14 is a side view illustrating a pressing operation of the electronic device housing according to embodiment 2.

An electronic device housing 1 according to embodiment 2 will be described. FIG. 12 is an enlarged perspective view showing a pressing structure at a specific part of the electronic device housing 1, FIG. 13 is a side view illustrating the pressing structure (a part enclosed by a broken line in FIG. 12) of the electronic device housing 1, and FIG. 14 is a side view illustrating a pressing operation of the electronic device housing 1. In FIG. 13, the arm portion 11 in an original state of being provided to the cover 10 (a state of not bending), and the protrusion 21, are shown in an overlapping manner. In the electronic device housing 1 according to embodiment 2, a flat-surface portion 23 is provided to the protrusion 21, and a curved-surface portion 13 is provided to the arm portion 11.

In FIG. 12, only one protrusion 21 provided to the side-surface portion 20b of the case 20 and the arm portion 11 pressing the protrusion 21 are shown, but as in the electronic device housing 1 shown in embodiment 1, two protrusions 21 are provided to the side-surface portion 20b and the arm portions 11 contact with the respective protrusions 21. Two flat-surface portions 23 provided on a side of each side line of the cover 10 where the two arm portions 11 are provided are inclined such that the interval between the two flat-surface portions 23 is narrowed toward the bottom-surface portion 20a. As shown in FIG. 13, the inclination can be defined as an angle with respect to the direction in which the arm portion 11 extends toward the bottom-surface portion 20a, and here, the angle of the inclination is denoted by $\theta$. The curved-surface portion 13 provided to the arm portion 11 is formed as a part of a columnar shape. The arm portion 11 and the protrusion 21 are arranged in such a positional relationship that causes overlap A. FIG. 14 shows the arm portion 11a contacting with the protrusion 21. When the arm portion 11 and the protrusion 21 contact with each other, the arm portion 11 bends by $\theta a$, as shown in FIG. 14. Here, $\theta a$ denotes an angle between the direction in which the arm portion 11 extends toward the bottom-surface portion 20a and the direction in which the arm portion 11 bending by the arm portion 11 and the protrusion 21 contacting with each other extends.

When the arm portion 11 and the protrusion 21 contact with each other, as shown in FIG. 12, the arm portion 11 bends with the force Fa in the direction normal to the tangent line between the flat-surface portion 23 and the curved-surface portion 13. With this force Fa, the force Fb to bend the cover 10 is generated. With the force Fb, the internal component (not shown) stored in the case 20 is pressed by the cover 10 toward the bottom-surface portion 20a. By the pressing, the internal component is stably fixed inside the electronic device housing 1.

In the configuration in which the arm portion 11 presses the protrusion 21 according to embodiment 2, inclination of the flat-surface portion 23 need not be set so that $\theta$ is greater than $\theta a$. This is because fitting between the cover 10 and the case 20 is established even when $\theta a$ is greater than $\theta$. The angle $\theta a$ is set using only an allowable value of stress occurring in each arm portion 11 upon fitting. The angle $\theta$ of inclination of the flat-surface portion 23 is set in a range of 10 degrees to 20 degrees. Although depending on the positional relationship between the flat-surface portion 23 and the curved-surface portion 13, since the angle $\theta$ is in a range of 10 degrees to 20 degrees, the angle $\theta a$ is approximately in a range of 10 degrees to 20 degrees. Setting the lower limit of the angle $\theta$ at 10 degrees is for obtaining the force Fb needed for the pressing. If the angle $\theta$ is smaller than 10 degrees, the angle $\theta a$ by which the arm portion 11 bends is also smaller than 10 degrees, so that the bending amount of the arm portion 11 is small and the force Fb needed for the pressing cannot be obtained. Setting the upper limit of the angle $\theta$ at 20 degrees is for preventing plastic deformation of the arm portion 11. If the angle $\theta$ is greater than 20 degrees, the angle $\theta a$ by which the arm portion 11 bends is also greater than 20 degrees, so that the bending amount of the arm portion 11 is great and the arm portion 11 is plastically deformed. If the arm portion 11 is plastically deformed, the force Fb needed for the pressing cannot be stably obtained.

As described above, in the electronic device housing 1 according to embodiment 2, the curved-surface portion 13 is provided to the arm portion 11, and the flat-surface portion 23 is provided to the protrusion 21. Therefore, the magnitude relationship between $\theta$ and $\theta a$ need not be considered, and the curved-surface portion 13 and the flat-surface portion 23 can be easily designed. In addition, since the angle $\theta$ of inclination of the flat-surface portion 23 is set to be not greater than 20 degrees, the force Fb needed for pressing the internal component 100 can be obtained without plastic deformation of the arm portion 11. In addition, since the curved-surface portion 13 is formed as a part of a columnar shape, the structure is simple and manufacturing can be performed through a simple manufacturing process.

Embodiment 3

Figure 15:
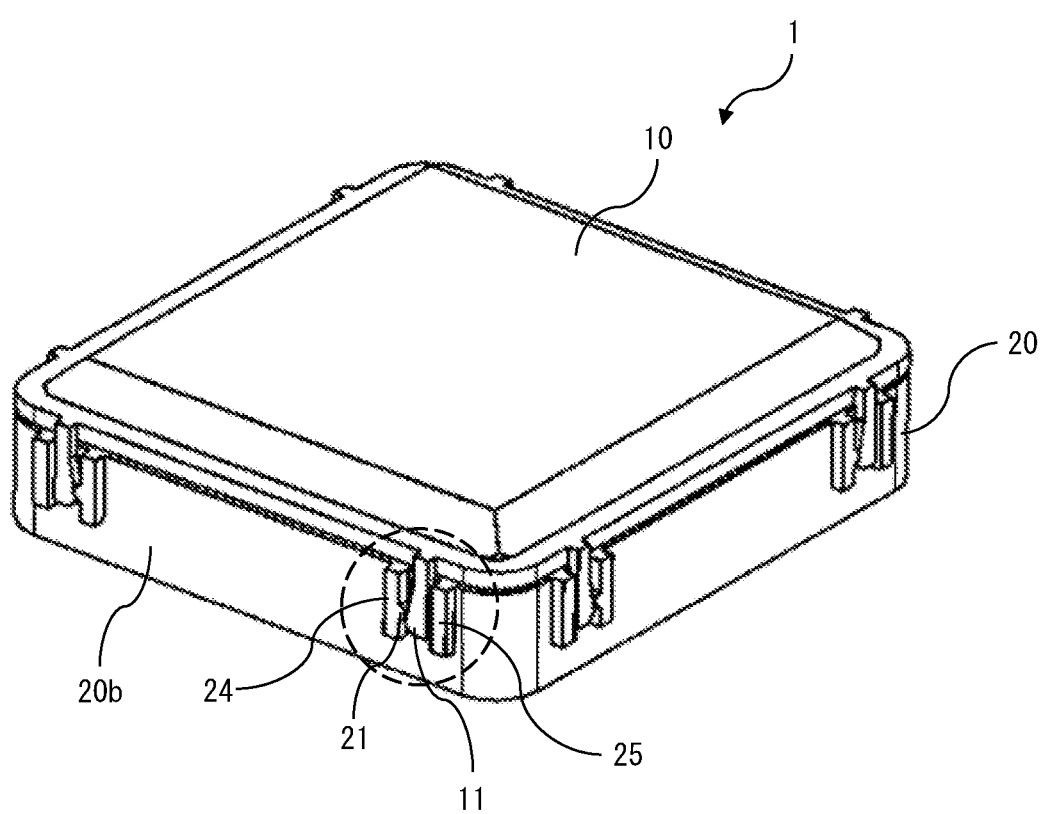
FIG. 15 is a perspective view showing the outer appearance of an electronic device housing according to embodiment 3.
Figure 16:
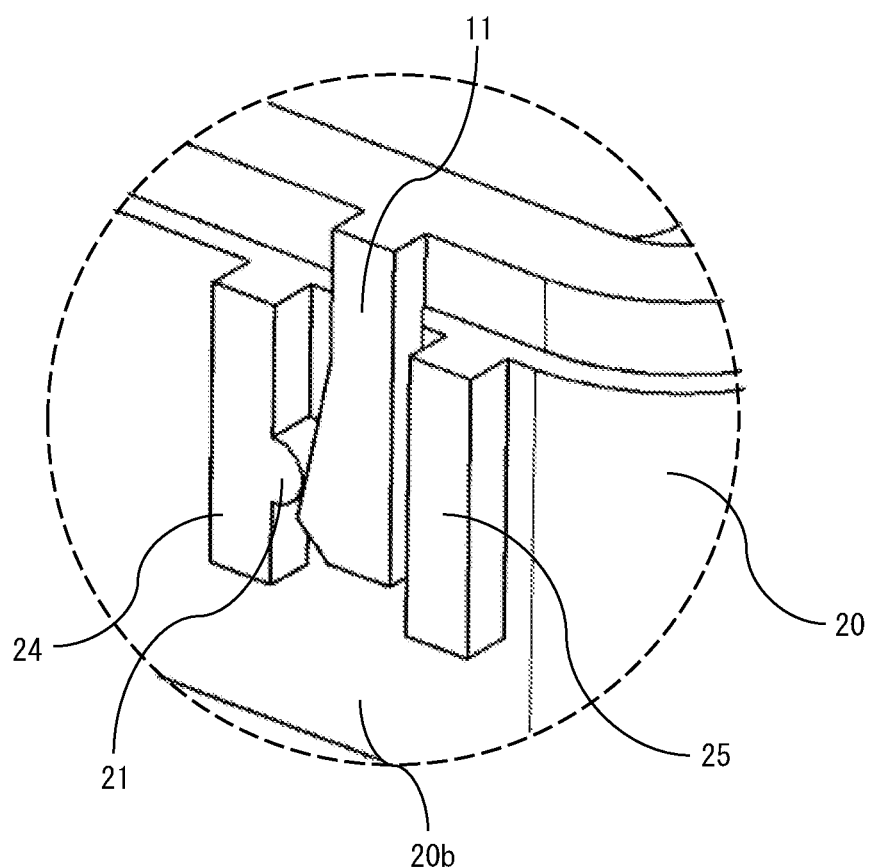
FIG. 16 is a perspective view showing a pressing structure of the electronic device housing according to embodiment 3.

An electronic device housing 1 according to embodiment 3 will be described. FIG. 15 is a perspective view showing the outer appearance of the electronic device housing 1, and FIG. 16 is an enlarged perspective view showing the pressing structure (a part enclosed by a broken line in FIG. 15) at a specific part of the electronic device housing 1. In the electronic device housing 1 according to embodiment 3, guide portions 24, 25 are provided to the side-surface portion 10a.

The arm portion 11 has a thin elongated shape so that the arm portion 11 easily bends when pressing the protrusion 21. Therefore, if any external force is applied to the arm portion 11, the arm portion 11 might be damaged. For protecting the arm portion 11 from the external force, the guide portions 24, 25 are provided on both sides of the arm portion 11. The guide portions 24, 25 are provided to the side-surface portion 20b so as to protrude from the side-surface portion 20b along the arm portion 11. The guide portions 24, 25 are each provided with at least the same length as a length, of the arm portion 11, on the side-surface portion 20*b*. The guide portions 24, 25 are provided at such positions as not to prevent the arm portion 11 from bending when pressing the protrusion 21. The guide portions 24, 25 are made of the same material as the case 20 to which the guide portions 24, 25 are provided, and they are integrated with the case 20. The configuration of the guide portions 24, 25 is not limited thereto. The guide portions 24, 25 formed as separate members may be attached to the side-surface portion 10*a*.

The guide portion 24 provided on the protrusion 21 side of the arm portion 11 is formed integrally with the protrusion 21. This is for decreasing components provided on the side-surface portion 20*b*. Since the guide portion 24 and the protrusion 21 are integrated with each other, the shape of the curved-surface portion 22 provided to the protrusion 21 is not a columnar shape but a part of a columnar shape.

In the above description, the guide portions 24, 25 are provided to the electronic device housing 1 according to embodiment 1. However, the configuration where the guide portions 24, 25 are provided is not limited thereto, and the guide portions 24, 25 may be provided to the electronic device housing 1 according to embodiment 2. In FIG. 15, the guide portions 24, 25 are provided on both sides of every arm portion 11, but without limitation thereto, the guide portions 24, 25 may be provided to only the side-surface portion 20*b* where an external force is likely to be applied to the arm portion 11. The guide portion 24 or the guide portion 25 may be provided on only one side of the arm portion 11 to which an external force is likely to be applied.

As described above, in the electronic device housing 1 according to embodiment 3, the guide portions 24, 25 are provided to the side-surface portion 20*b* so as to protrude from the side-surface portion 20*b* along the arm portion 11. Thus, an external force can be prevented from being directly applied to the arm portion 11, whereby damage to the arm portion 11 can be prevented. In addition, since the guide portion 24 provided on the protrusion 21 side of the arm portion 11 is formed integrally with the protrusion 21, components provided on the side-surface portion 20*b* of the case 20 are decreased, whereby the structure of the electronic device housing 1 can be simplified.

Embodiment 4

Figure 17:
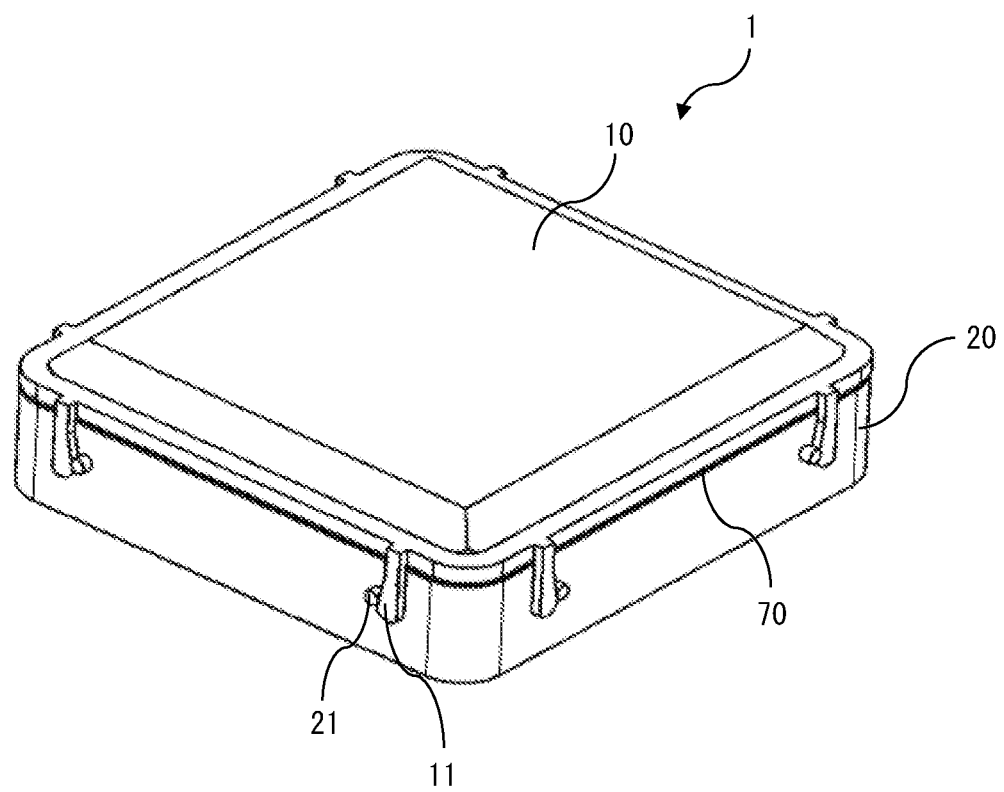
FIG. 17 is a perspective view showing the outer appearance of an electronic device housing according to embodiment 4.

An electronic device housing 1 according to embodiment 4 will be described. FIG. 17 is a perspective view showing the outer appearance of the electronic device housing 1. In the electronic device housing 1 according to embodiment 4, an adhesive agent is provided between the cover 10 and the case 20.

For example, if the electronic device housing 1 is mounted in a usage environment subjected to violent vibration, the force Fb to press the internal component stored in the electronic device housing 1 by the cover 10 might become insufficient. If the force Fb is insufficient, the internal component is moved by violent vibration. If the internal component is moved, the distance between the internal component and the cover 10 is not stabilized, and the internal component is not fixed by the cover 10. For stably fixing the internal component, an adhesive agent 70 is applied at a part where the cover 10 and the case 20 contact with each other, between the cover 10 and the case 20. By joining the cover 10 and the case 20 with the adhesive agent 70, the cover 10 and the case 20 are integrated by the adhesive agent 70. By integrating the cover 10 and the case 20, also with the force Fb, movement of the internal component is inhibited and the internal component can be stably fixed. The part where the adhesive agent 70 is applied and the cover 10 and the case 20 contact with each other is a periphery of the cover 10. The application range of the adhesive agent 70 is not limited to the entire periphery around the cover 10, and may be set as appropriate in accordance with vibration applied to the electronic device housing 1, or the like. If the entire periphery of the cover 10 and the case 20 are joined by the adhesive agent 70, the electronic device housing 1 can be imparted with a waterproof function.

As described above, in the electronic device housing 1 according to embodiment 4, the adhesive agent 70 is applied between the cover 10 and the case 20. Therefore, even if the electronic device housing 1 is subjected to violent vibration, the internal component stored in the electronic device housing 1 can be stably fixed inside the electronic device housing 1. In addition, if the entire periphery of the cover 10 and the case 20 are joined by the adhesive agent 70, the electronic device housing 1 can be imparted with a waterproof function.

Although the disclosure is described above in terms of various exemplary embodiments and implementations, it should be understood that the various features, aspects, and functionality described in one or more of the individual embodiments are not limited in their applicability to the particular embodiment with which they are described, but instead can be applied, alone or in various combinations to one or more of the embodiments of the disclosure.

It is therefore understood that numerous modifications which have not been exemplified can be devised without departing from the scope of the present disclosure. For example, at least one of the constituent components may be modified, added, or eliminated. At least one of the constituent components mentioned in at least one of the preferred embodiments may be selected and combined with the constituent components mentioned in another preferred embodiment.

DESCRIPTION OF THE REFERENCE CHARACTERS 1 electronic device housing
10 cover
10*a* side-surface portion
10*b* opposed surface
11 arm portion
12 flat-surface portion
13 curved-surface portion
20 case
20*a* bottom-surface portion
20*b* side-surface portion
20*c* end
21 protrusion
22 curved-surface portion
23 flat-surface portion
24 guide portion
25 guide portion
30 radio-wave shield
40 antenna board
50 heatsink
60 control board
70 adhesive agent
100 internal component

The invention claimed is:

1. An electronic device housing comprising:
a case having a bottom-surface portion in a rectangular shape and side-surface portions provided so as to stand around the bottom-surface portion; and
a cover opposed to the bottom-surface portion and covering an opening enclosed by ends of a plurality of the side-surface portions, wherein
at positions along each of at least two opposing side lines of the cover, two flexible arm portions are provided so as to extend toward the bottom-surface portion along the corresponding side-surface portion, and two protrusions are provided between the two arm portions so as to protrude from the side-surface portion and are held between the two arm portions so as to contact therewith,
contact parts of either the arm portions or the protrusions have curved-surface portions, and contact parts of others have flat-surface portions,
two of the flat-surface portions provided on a side of each side line of the cover where the two arm portions are provided are inclined such that an interval between the two flat-surface portions is narrowed toward the bottom-surface portion and are closest to each other nearer to the bottom-surface portion than to portions of the cover from which the two of the flat-surface portions are protruded from the cover, and
the arm portions bend while pressing the protrusions at positions contacting with the protrusions.

2. The electronic device housing according to claim 1, wherein
the flat-surface portions are provided to the arm portions, and the curved-surface portions are provided to the protrusions.

3. The electronic device housing according to claim 1, wherein
an angle between a direction in which each arm portion extends and a direction in which the arm portion bending by the arm portion and the corresponding protrusion contacting with each other extends is in a range of 10 degrees to 20 degrees.

4. The electronic device housing according to claim 2, wherein
an angle between a direction in which each arm portion extends and a direction in which the arm portion bending by the arm portion and the corresponding protrusion contacting with each other extends is in a range of 10 degrees to 20 degrees.

5. The electronic device housing according to claim 1, wherein
each curved-surface portion has a columnar shape or is formed as a part of a columnar shape.

6. The electronic device housing according to claim 2, wherein
each curved-surface portion has a columnar shape or is formed as a part of a columnar shape.

7. The electronic device housing according to claim 3, wherein
each curved-surface portion has a columnar shape or is formed as a part of a columnar shape.

8. The electronic device housing according to claim 4, wherein
each curved-surface portion has a columnar shape or is formed as a part of a columnar shape.

9. The electronic device housing according to claim 1, wherein
a guide portion is provided to the side-surface portion so as to protrude from the side-surface portion along the arm portion.

10. The electronic device housing according to claim 9, wherein
the guide portion provided on a protrusion side of the arm portion is formed integrally with the protrusion.

11. The electronic device housing according to claim 1, wherein
an adhesive agent is applied between the cover and the case.

* * * * *